(12) United States Patent
Andoh et al.

(10) Patent No.: US 8,148,879 B2
(45) Date of Patent: Apr. 3, 2012

(54) SHEET-TYPE VIBRATOR AND ACOUSTIC APPARATUS

(75) Inventors: Masamichi Andoh, Nagaokakyo (JP); Osamu Nakagawara, Nagaokakyo (JP); Souko Fukahori, Nagaokakyo (JP)

(73) Assignee: Murata Manufacturing Co., Ltd., Nagaokakyo-Shi, Kyoto-fu (JP)

( * ) Notice: Subject to any disclaimer, the term of this patent is extended or adjusted under 35 U.S.C. 154(b) by 0 days.

(21) Appl. No.: 12/954,726

(22) Filed: Nov. 26, 2010

(65) Prior Publication Data

US 2011/0062829 A1 Mar. 17, 2011

Related U.S. Application Data

(63) Continuation of application No. PCT/JP2009/052137, filed on Feb. 9, 2009.

(30) Foreign Application Priority Data

May 29, 2008 (JP) ................................ 2008-140976

(51) Int. Cl.
*H01L 41/047* (2006.01)
*H01L 41/09* (2006.01)

(52) U.S. Cl. .................... 310/363; 310/328; 310/800

(58) Field of Classification Search .................. 310/328, 310/363, 800

See application file for complete search history.

(56) References Cited

U.S. PATENT DOCUMENTS

| | | | |
|---|---|---|---|
| 5,268,571 A | 12/1993 | Yamamoto et al. | |
| 5,733,683 A | 3/1998 | Searson et al. | |
| 6,120,940 A | 9/2000 | Poehler et al. | |
| 6,323,988 B1 | 11/2001 | Heuer et al. | |
| 6,327,070 B1 | 12/2001 | Heuer et al. | |
| 6,427,017 B1 | 7/2002 | Toki | |
| 7,285,314 B2 | 10/2007 | Mukonoki et al. | |
| 7,459,832 B2 | 12/2008 | Nitto et al. | |
| 7,639,826 B1 | 12/2009 | Azima et al. | |
| 2004/0090426 A1 | 5/2004 | Bourdelais et al. | |

(Continued)

FOREIGN PATENT DOCUMENTS

JP 50-117772 U 3/1949

(Continued)

OTHER PUBLICATIONS

PCT/JP2009/050236 International Search Report dated Apr. 28, 2009.

(Continued)

*Primary Examiner* — Thomas M Dougherty
(74) *Attorney, Agent, or Firm* — Dickstein Shapiro LLP

(57) ABSTRACT

In a sheet-type piezoelectric vibrator provided with a piezoelectric sheet made from a transparent organic polymer and electrodes formed on respective main surfaces that are opposite to each other of the piezoelectric sheet, an electrode material that is effectively used for making the vibrator colorless is provided. The first electrodes formed on one of the main surfaces of piezoelectric sheets are made of zinc oxide electrode layers, each mainly containing zinc oxide, and second electrodes formed on the other main surface of the piezoelectric sheets include polythiophene electrode layers made from a conductive polymer containing thiophene in a molecule structure thereof. Although the zinc oxide electrode layer is transparent, it is slightly yellowish, while, on the other hand, although the polythiophene electrode layer is also transparent, it is slightly bluish. Since the spectral characteristic of light transmitted through these two electrode layers is made substantially flat in the visible region, the coloring of the transmitted light is suppressed so that the layers appear colorless and transparent.

19 Claims, 6 Drawing Sheets

U.S. PATENT DOCUMENTS

| | | |
|---|---|---|
| 2007/0187794 A1 | 8/2007 | Fukuyoshi et al. |
| 2010/0102309 A1 | 4/2010 | Nakahara et al. |

FOREIGN PATENT DOCUMENTS

| | | | |
|---|---|---|---|
| JP | 50-083798 A | | 7/1975 |
| JP | 63-104386 A | | 5/1988 |
| JP | 05-022068 A | | 1/1993 |
| JP | 05-022069 A | | 1/1993 |
| JP | 05-052508 A | | 3/1993 |
| JP | 05-067939 A | | 3/1993 |
| JP | 05-122793 A | | 5/1993 |
| JP | 05-152638 A | | 6/1993 |
| JP | 05-347439 A | | 12/1993 |
| JP | 06-061776 A | | 3/1994 |
| JP | 06-349338 A | | 12/1994 |
| JP | 09-327094 A | | 12/1997 |
| JP | 2000-02899 | | 1/2000 |
| JP | 2000-152385 A | | 5/2000 |
| JP | 2001-504976 T | | 4/2001 |
| JP | 2001-135149 A | | 5/2001 |
| JP | 2000-10125 A | | 7/2001 |
| JP | 2003-125491 A | | 4/2003 |
| JP | 2003-244791 A | | 8/2003 |
| JP | 2003-244792 A | | 8/2003 |
| JP | 2004-127562 A | | 4/2004 |
| JP | 2004-158450 A | | 6/2004 |
| JP | 2004-245996 A | | 9/2004 |
| JP | 2005-006344 A | | 1/2005 |
| JP | 2005-213376 A | | 8/2005 |
| JP | 2005-277340 A | | 10/2005 |
| JP | 2005-303938 A | | 10/2005 |
| JP | 2005-311415 A | | 11/2005 |
| JP | 2006-155907 | * | 6/2006 |
| JP | 2006-179578 A | | 7/2006 |
| JP | 2006-239883 A | | 9/2006 |
| JP | 2007-036545 A | | 2/2007 |
| JP | 2007-518331 T | | 7/2007 |
| JP | 2007-199513 A | | 8/2007 |
| JP | 2007-300426 A | | 11/2007 |
| JP | 2006-88538 A | | 1/2008 |
| JP | 2008-211203 A | | 9/2008 |
| WO | WO-2005/067344 A1 | | 7/2005 |

OTHER PUBLICATIONS

PCT/JP2009/050236 Written Opinion dated Apr. 28, 2009.
PCT/JP2009/052137 International Search Report dated Feb. 27, 2009.
PCT/JP2009/052137 Written Opinion dated Feb. 27, 2009.

* cited by examiner

US 8,148,879 B2

SHEET-TYPE VIBRATOR AND ACOUSTIC APPARATUS

CROSS REFERENCE TO RELATED APPLICATIONS

The present application is a continuation of International Application No. PCT/JP2009/052137, filed Feb. 9, 2009, which claims priority to Japanese Patent Application No. JP2008-140976, filed May 29, 2008, the entire contents of each of these applications being incorporated herein by reference in their entirety.

TECHNICAL FIELD

The present invention relates to a sheet-type vibrator and an acoustic apparatus formed by using such a sheet-type vibrator, and more particularly concerns an improvement in material selection of electrodes used for a sheet-type vibrator that is provided with a functional sheet such as a piezoelectric sheet made from a transparent organic polymer.

BACKGROUND ART

For example, Japanese Unexamined Patent Publication No. 2003-244792 (Patent Document 1) has disclosed a transparent piezoelectric film speaker that can be disposed on a display of a portable telephone. This Patent Document 1 describes an example in which a PVDF (polyvinylidene fluoride) film is used as the piezoelectric film installed in the piezoelectric film speaker. Moreover, Patent Document 1 also describes that the use of a polymer piezoelectric film is preferable since no such brittleness as caused in ceramic materials is exerted. Moreover, Patent Document 1 exemplifies ITO (Indium Tin Oxide) as a material for a transparent electrode to be formed on the piezoelectric film, and also exemplifies a method such as a vacuum vapor deposition method and a sputtering method, as the method used for the formation thereof.

The above-mentioned ITO electrode can be advantageously used in LCD's (liquid crystal panels) and PDP's (plasma displays); however, in recent years, together with rapid spreads of FPD's (flat panel displays), there have been increasing demands for ITO electrodes for use in LCD's and PDP's. In this case, however, since indium contained in ITO is a rare metal, its starvation has been worried about, and its price has been soaring.

Moreover, upon sputtering ITO, a temperature close to about 200° C. is required. For this reason, it becomes difficult to apply the ITO sputtering upon forming an electrode on a sheet made from an organic polymer.

On the other hand, a conductive polymer containing thiophene in its molecule structure becomes substantially transparent when formed into a thin film, and the application of this material for electrodes has been described in, for example, Japanese Unexamined Patent Publication No. 2000-2899 (Patent Document 2), Japanese Unexamined Patent Publication No. 2000-10125 (Patent Document 3) and Japanese Patent Application National Publication (Laid-Open) No. 2001-504976 (Patent Document 4).

In the case of the conductive polymer containing thiophene in its molecule structure, no such problem of resource starvation as in the case of the above-mentioned ITO is raised. Moreover, examples of the conductive polymer containing thiophene in its molecule structure include polythiophene and polyethylene dioxythiophene, and since these materials can be handled in a state of an aqueous solution, by thinly applying this aqueous solution by the use of a method such as a spin-coating method and an ink-jet printing method, and by simply drying the solution, it is possible to form a film having a conductive characteristic. Therefore, this method is suitably applied to an electrode formation on a sheet made from an organic polymer.

However, as described in Patent Documents 2 to 4, the conductive polymer containing thiophene in its molecule structure is slightly colored. In general, the solution of the conductive polymer containing thiophene in its molecule structure has a dark blue color, and although it becomes transparent after the film formation, it has a slightly bluish color. For this reason, when used as an electrode material for a sheet-type vibrator, such as a transparent piezoelectric film speaker to be disposed on a display, it still has some room for improvement.

Patent Document 1: Japanese Unexamined Patent Publication No. 2003-244792
Patent Document 2: Japanese Unexamined Patent Publication No. 2000-2899
Patent Document 3: Japanese Unexamined Patent Publication No. 2000-10125
Patent Document 4: Japanese Patent Application National Publication (Laid-Open) No. 2001-504976

SUMMARY OF THE INVENTION

Therefore, an objective of this invention is to provide a sheet-type vibrator capable of making its electrodes transparent and colorless.

Another objective of this invention is to provide an acoustic apparatus that is constituted by using the above-mentioned sheet-type vibrator.

The present invention is first directed to a sheet-type vibrator that is provided with: a functional sheet made from a transparent organic polymer; and first and second electrodes that are respectively formed on first and second main surfaces opposite to each other of the functional sheet so that, by applying a voltage between the first and second electrodes, the functional sheet is driven to generate vibration, and in order to solve the aforementioned technical problems, the sheet-type vibrator is characterized in that the first electrode includes a zinc oxide electrode layer mainly containing zinc oxide, and the second electrode includes a polythiophene electrode layer made from a conductive polymer containing thiophene in its molecule structure.

In order to achieve a bimorph structure, the sheet-type vibrator is preferably provided with a plurality of the functional sheets that are laminated one after another.

Alternatively, so as to achieve the bimorph structure, the sheet-type vibrator is further provided with a backing sheet, made from a transparent organic polymer, that is bonded to the functional sheet, with the first electrode interposed therebetween.

Moreover, in its specific mode of the sheet-type vibrator in accordance with the present invention, the first electrode is made of the zinc oxide electrode layer, and the second electrode is made of the polythiophene electrode layer, and in another specific mode, each of the first and second electrodes includes both of the zinc oxide electrode layer and the polythiophene electrode layer. In the case of the latter mode, the zinc oxide electrode layer is formed on a side closer to the functional sheet, while the polythiophene electrode layer is formed on a side farther from the functional sheet.

In the case where the sheet-type vibrator of the present invention is provided with two of the laminated functional sheets, the first electrode of each of the functional sheets is made of the zinc oxide electrode layer, and placed in a manner so as to be sandwiched between the two laminated functional sheets, while the second electrode of each of the functional sheets is made of the polythiophene electrode layer, and placed on the outer side of each of the two laminated functional sheets.

In another aspect, a sheet-type vibrator relating to the present invention is provided with a plurality of functional sheets, made from a transparent organic polymer, that are laminated one after another, and electrodes that are respectively formed on respective main surfaces opposite to each other of the functional sheet so that, by applying a voltage between the electrodes that are respectively formed on the main surfaces opposite to each other of the functional sheet, the functional sheet is driven to generate vibration, and the sheet-type vibrator is characterized in that the plurality of electrodes include those electrodes, each having a zinc oxide electrode layer mainly containing zinc oxide, and those electrodes, each having a polythiophene electrode layer made from a conductive polymer containing thiophene in a molecule structure thereof.

In the above-mentioned modes, in the case where the sheet-type vibrator has at least three of the functional sheets, the functional sheets are preferably arranged so that those electrodes, formed on the respective main surfaces of the functional sheet that is placed on a comparatively inner side in a lamination direction, are made of zinc oxide electrode layers mainly containing zinc oxide, and those electrodes, formed on the respective main surfaces of the functional sheet that is placed on a comparatively outer side in the lamination direction, are made of polythiophene electrode layers, each made from a conductive polymer containing thiophene in a molecule structure thereof.

In the sheet-type vibrator in accordance with the present invention, each of the functional sheets is preferably a piezoelectric sheet made from a piezoelectric material that is driven based upon a piezoelectric characteristic. In this case, in particular, the organic polymer forming the functional sheets is preferably made from polylactate.

Moreover, the zinc oxide electrode layer preferably has a crystalline form in which c-axes are grown in a plurality of directions that are mutually different from one another.

Furthermore, the zinc oxide electrode layer includes zinc oxide doped with at least one kind selected from the group consisting of Ga, Al and In at a doping concentration in a range from 7 to 40% by weight in terms of each oxide conversion.

The conductive polymer containing thiophene in its molecule structure that forms the polythiophene electrode layers is preferably polyethylene dioxythiophene.

The present invention is also directed to an acoustic apparatus that is provided with the sheet-type vibrator relating to the present invention.

The sheet-type vibrator in accordance with the present invention has a structure relating to electrodes formed on a functional sheet in which a zinc oxide electrode layer and a polythiophene electrode layer are formed so as to overlap with each other. In this case, the zinc oxide electrode layer has a lower transmittance in a short-wavelength region less than 400 nm, although it has a transmittance of 80% or more with respect to light in a visible region of 400 to 800 nm, with the result that the zinc oxide electrode layer has a slight yellowish color although it is transparent. In contrast, as described earlier, the polythiophene electrode layer has a slight bluish color although it is transparent. In accordance with the present invention, since the zinc oxide electrode layer and polythiophene electrode layer have an overlapped structure with each other, the color tone of the transmitted light through the respective electrode layers is determined in accordance with the subtractive mixture of color. Therefore, the transmittance of the transmitted light is represented by a product of the transmittance of the zinc oxide electrode layer and the transmittance of the polythiophene electrode layer, and the inventors of the present invention have found that at this time, the spectral characteristic of light is made substantially flat in the visible region. Thus, the coloring of the transmitted light is suppressed so that the layers are made colorless and transparent. Moreover, depending on the thickness of each of the electrode layer, however, since the light transmittance of both of the zinc oxide electrode layer and the polythiophene electrode layer is high, the transmittance of the entire sheet-type vibrator can be maintained in a high level.

In the sheet-type vibrator of the present invention, when a plurality of laminated functional sheets are installed, the thickness of each of the functional sheets can be easily made thinner in accordance with an increase of the number of the functional sheets, and by making the thickness thinner, the electric field intensity to be imposed on each of the functional sheets can be easily enhanced so that the amplitude of the sheet-type vibrator can be increased.

In the case where the respective electrodes include both of the zinc oxide electrode layer and the polythiophene electrode layer, by forming the zinc oxide electrode layer on a side closer to the functional sheet with the polythiophene electrode layer being formed on a side farther from the functional sheet, it is possible to effectively suppress deformations, such as shrinkage of the functional sheet due to heat, by the zinc oxide electrode layer. Moreover, even in the case where a micro-crack occurs in the zinc oxide electrode layer due to repeated expansions and contractions upon driving the sheet-type vibrator, since this is covered with the polythiophene electrode layer, there is no possibility of an electrical fracture that is a critical failure. Moreover, since the conductivity of the zinc oxide electrode layer is several tens of times higher than that of the polythiophene electrode layer, it is possible to drive the sheet-type vibrator at low power consumption.

In the case of the sheet-type vibrator of the present invention provided with two of the laminated functional sheets, when the first electrode of each of the functional sheets is made of the zinc oxide electrode layer, and positioned in a manner so as to be sandwiched between the two laminated functional sheets, while the second electrode of each of the functional sheets is made of the polythiophene electrode layers, and positioned on the outside of each of the two laminated functional sheets, since the comparatively hard zinc oxide electrode layers are placed on a portion of the sheet-type vibrator having minimum mechanical expansion and contraction, with the polythiophene electrode layers that are easily expanded and contracted being placed on a portion having maximum mechanical expansion and contraction, it is possible to reduce factors that hinder the bending vibration of the sheet-type vibrator.

In the case of the sheet-type vibrator of the present invention provided with at least three functional sheets, in the case where, among the functional sheets, electrodes, formed on the respective main surfaces of the functional sheets located on comparatively inner sides in the lamination direction, are made of zinc oxide electrode layers, while electrodes, formed on the respective main surfaces of the functional sheets located on comparatively outer sides in the lamination direction, are made of polythiophene electrode layers, in the same manner as described earlier, since the zinc oxide electrode layers are placed on a portion of the sheet-type vibrator having minimum mechanical expansion and contraction, with the polythiophene electrode layers being placed on a portion having maximum mechanical expansion and contraction, it is possible to reduce factors that hinder the bending vibration of the sheet-type vibrator.

In the sheet-type vibrator of the present invention, in the case where the functional sheet is prepared as a piezoelectric sheet, which is made from polylactate, the functional sheet becomes superior in transparency so that the sheet-type vibrator is consequently made superior in transparency. Moreover, by using polylactate, it is possible to achieve a stable piezoelectric characteristic and also to obtain a piezoelectric sheet at low costs. Furthermore, since the polylactate is carbon neutral, and has biodegradability, the use thereof is preferable from the viewpoint of environmental preservation of the earth.

In the case where the zinc oxide electrode layer has a crystalline form in which c-axes are grown in a plurality of directions that are mutually different from one another, it is made superior in moisture resistance. Thus, it becomes possible to carry out film-forming operations at normal temperatures.

Moreover, in the case where the zinc oxide electrode layer includes zinc oxide doped with at least one kind of elements selected from the group consisting of Ga, Al and In at a doping concentration in a range from 7 to 40% by weight in terms of each oxide conversion, the above-mentioned crystalline form can be achieved, while maintaining superior moisture resistance.

In the case where the conductive polymer containing thiophene in its molecule structure, which forms the polythiophene electrode layer, is prepared as polyethylene dioxythiophene, the polythiophene electrode layer is allowed to have high conductivity.

In the case where an acoustic apparatus is formed by using the sheet-type vibrator of the present invention, it becomes possible to produce, for example, a transparent speaker. Such a speaker can be directly disposed even on a surface of a display, without blocking visual recognition.

Figure 1:
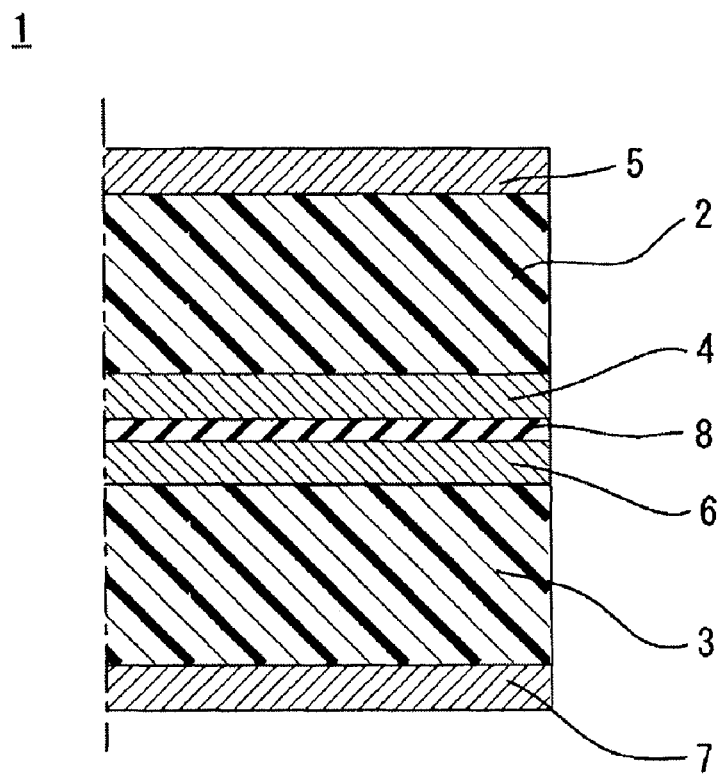
FIG. 1 is an enlarged cross-sectional view that shows one portion of a sheet-type vibrator 1 in accordance with a first embodiment of the present invention.

DESCRIPTION OF REFERENCE SYMBOLS 1, 11, 21, 21a, 31 Sheet-type vibrator
2, 3, 12, 13, 22, 32 to 35 Piezoelectric sheet
4 to 7, 14 to 17, 23, 24, 36 to 43 Electrode
8, 18, 26, 44 to 46 Adhesive layer
19, 27 Zinc oxide electrode layer
20, 28 Polythiophene electrode layer
49 Portable game machine
51 Portable telephone

DETAILED DESCRIPTION OF THE INVENTION

FIG. 1 is an enlarged cross-sectional view that shows one portion of a sheet-type vibrator 1 in accordance with the first embodiment of the present invention.

The sheet-type vibrator 1 has a bimorph structure in which two piezoelectric sheets 2 and 3 serving as functional sheets are bonded to each other. On first and second main surfaces opposite to each other of one of the piezoelectric sheets 2, first and second electrodes 4 and 5 are respectively formed, and on first and second main surfaces opposite to each other of the other piezoelectric sheet 3, first and second electrodes 6 and 7 are respectively formed. In this embodiment, the first electrodes 4 and 6 are positioned in a manner so as to be sandwiched between the two sheets of the piezoelectric sheets 2 and 3, while, on the other hand, the second electrodes 5 and 7 are positioned respectively on the outsides of the two piezoelectric sheets 2 and 3. One of the first electrodes 4 and the other first electrode 6 are joined to each other with an adhesive layer 8 interposed therebetween. For example, a transparent epoxy-based adhesive is used so as to form the adhesive layer 8, and the adhesive members are preferably pressed by using a laminator, with no bubbles being mingled therein, and bonded to each other.

The piezoelectric sheets 2 and 3 are made from a transparent organic polymer, and as this organic polymer, a poly L-lactate (PLLA) is preferably used. The PLLA is a chiral polymer with its main chain having a spiral structure. It has been known that when such a sheet made from the PLLA is monoaxially drawn so that its molecules are oriented, the resulting sheet exerts a piezoelectric characteristic. Among polymers, the piezoelectric constant has a very high level. Since the group of points of the PLLA crystals is represented by $D_2$, there are components of $d_{14}$, $d_{25}$ and $d_{36}$, and in the drawn sheet, $d_{25}=-d_{14}$ and $d_{36}=0$ are held so that upon application of an electric field in a normal direction to the electrode surface, a so-called shear piezoelectric characteristic that causes a strain in a rotation direction is exerted. The PLLA exerts a piezoelectric characteristic only when drawn, and there is no need for a poling process as in the case of the other polymers (polyvinylidene fluoride: PVDF) and piezoelectric ceramics. In the case of the PVDF or the like, there is a phenomenon in which the piezoelectric constant becomes smaller with time; however, in the case of the PLLA, it is possible to stably maintain the piezoelectric characteristic.

Moreover, the transparency of the PLLA is very high, and the light transmittance of a pure PLLA reaches as high as 94%. This is such a high value as to exceed 93% that corresponds to a light transmittance of polymethyl methacrylate that is referred to as having the highest transmittance among polymers.

Furthermore, since the PLLA is a resin that is produced by using, for example, corn as its raw material, hardly any extra carbon dioxide is discharged when produced, and since the PLLA also has biodegradability, it returns to nature when disposed as waste, thereby making it possible to provide a material that hardly causes any environmental load.

The glass transition point of PLLA is generally located within a range of 60° C. to 70° C., although it varies depending on the crystallinity and molecular weight. For this reason, it might be softened and deformed under temperatures exceeding this range. This needs to be taken into account when the electrodes 4 to 7 are formed.

It is proposed to use ZnO as the material for the transparent electrode; however, ZnO has a problem in that its oxygen vacancy serving as a carrier supply source is re-oxidized through a reaction with moisture in the air to cause an increase in resistivity. This degradation of weather resistance causes the highest obstacle against a practical application of ZnO, and no example of mass production in which ZnO is used as a material for transparent electrodes has been reported yet. Moreover, in order to improve the electron mobility by using ZnO to obtain an electrode with low resistivity, it is necessary to carry out a process for allowing crystal grains to sufficiently grow by carrying out a film-forming process while heating at a temperature of about 200° C., in the same manner as in the above-mentioned ITO process.

On the other hand, a transparent electrode, formed by using a magnetron sputtering method of an off-axis type, with ZnO being doped with Ga serving as a IIIB family element at a high concentration of 7% by weight or more ($Ga_2O_3$ conversion), has a crystal structure that is greatly different from a C-axis oriented film subjected to a conventional pillar-shaped growth. The high-concentration doped ZnO film has a peculiar crystalline form in which C-planes, each serving as a stable plane, are grown in various directions so that by forming a three-dimensional intergranular network, the intergranular diffusion of $H_2O$ is suppressed; thus, the activating energy of a reaction (re-oxidizing reaction for oxygen vacancy) between $H_2O$ and ZnO is increased to provide a superior moisture resistant characteristic. Moreover, since a film-forming process at a normal temperature is available, it is possible to carry out a film-forming process on a polymer sheet, such as a piezoelectric sheet 2 or 3, having a lower temperature resistance in comparison with that of ceramic materials and glass, without causing any problems.

Each of the above-mentioned first electrodes 4 and 6 includes a zinc oxide electrode layer mainly containing ZnO, more specifically, a zinc oxide electrode layer made of the ZnO doped with high concentration. However, this zinc oxide electrode layer has a lower transmittance in a short-wavelength region less than 400 nm, although it has a transmittance of 80% or more with respect to light in a visible region of 400 to 800 nm, with the result that the zinc oxide electrode layer has a slight yellowish color although it is transparent.

In order to alleviate such a defect of the zinc oxide electrode layer, the second electrodes 5 and 7 include polythiophene electrode layers made from the aforementioned conductive polymer containing thiophene in its molecule structure. The polythiophene electrode layer of this type has a slight bluish color, although it is transparent.

Therefore, by forming the first electrodes 4 and 6 using zinc oxide electrode layers, as well as by forming the second electrodes 5 and 7 using polythiophene electrode layers, it is possible to achieve a structure in which the zinc oxide electrode layer and the polythiophene electrode are overlapped with one another. Since the spectral characteristic of light transmitted through these two electrode layers is made substantially flat in the visible region, the coloring of the transmitted light is suppressed so that the layers are made colorless and transparent.

As described earlier, the PLLA forming the piezoelectric sheets 2 and 3 loses its piezoelectric characteristic when the temperature becomes the glass transition temperature or more, and when the temperature drops, the PLLA returns to the state having its original piezoelectric constant. In this case, with respect to the temperature rise, the practically applicable temperature is assumed, and a temperature exceeding 85° C. is not assumed. However, as described earlier, when the temperature drops to cause a deformation (contraction) during the drop, the drawing effect is changed to cause a reduction in the piezoelectric constant. The zinc oxide electrode layer has a certain degree of hardness even in the case of a thin film; therefore, by forming the first electrodes 4 and 6 made of the zinc oxide electrode layers on the piezoelectric sheets 2 and 3 made from the PLLA, it becomes possible to suppress the deformation (contraction) of the piezoelectric sheets 2 and 3 made from the PLLA, and consequently to enhance the heat resistant characteristic of the sheet-type vibrator 1.

Moreover, in the case where the first electrodes 4 and 6, made of the zinc oxide electrode layers, are positioned in a manner so as to be sandwiched between the two piezoelectric sheets 2 and 3, with the second electrodes 5 and 7, made of the polythiophene electrode layers, being positioned respectively on the outsides of the two sheets of the piezoelectric sheets 2 and 3, since the comparatively hard zinc oxide electrode layers are placed on a portion of the sheet-type vibrator 1 having minimum mechanical expansion and contraction, with the polythiophene electrode layers that are easily expanded and contracted being placed on a portion having maximum mechanical expansion and contraction, it is possible to reduce factors that hinder the bending vibration of the sheet-type vibrator 1.

Figure 2:
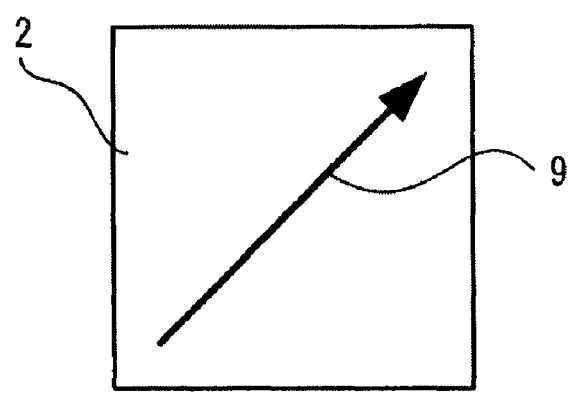
FIG. 2 is a plan view that shows a piezoelectric sheet 2 as a single unit taken out from the sheet-type vibration 1 shown in FIG. 1, and is used for explaining the sheet in its extending direction.

FIG. 2 is a plan view that shows one of piezoelectric sheets 2 as a single unit taken out from the sheet-type vibrator 1 shown in FIG. 1. As described earlier, the piezoelectric sheet 2 includes the PLLA sheet. The piezoelectric sheet 2 has a drawing direction indicated by a vector 9. Normally, after having been cast-molded, the PLLA sheet is drawn by 2 to 6 times longer so that it is allowed to exert a piezoelectric characteristic. Moreover, by preliminarily kneading a predetermined nano-size inorganic substance together with the PLLA sheet, the piezoelectric characteristic of the PLLA sheet can be improved without substantially impairing its transparency.

Figure 3A:
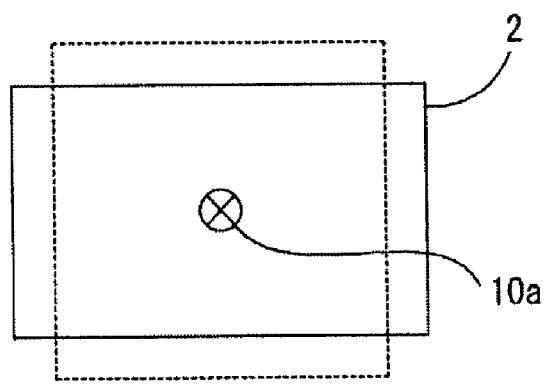
FIGS. 3(a) and 3(b) are plan views that show a deformed state of the piezoelectric sheet 2 shown in FIG. 2 upon application of an electric field thereto.
Figure 3B:
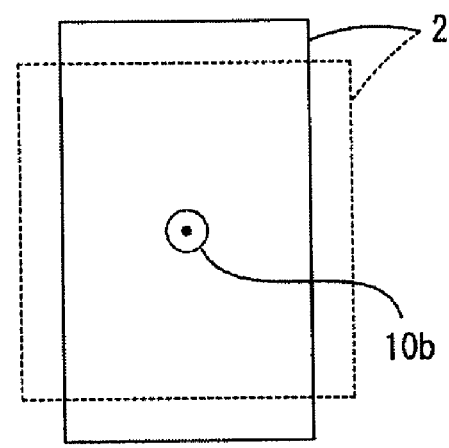

On the piezoelectric sheet 2, made from the PLLA and cut out with an angle of 45 degrees relative to the drawing axis, the first and second electrodes 4 and 5 are formed as described earlier, and by applying a voltage to these, a deformation as shown in FIGS. 3(a) and 3(b) is caused by the effect of its piezoelectric constant $d_{14}$. That is, it is deformed from the original state indicated by a broken line shown in FIG. 3 to a state indicated by a solid line.

In FIGS. 3(a) and 3(b), electric field vectors 10a and 10b, caused by an applied voltage, are shown. The electric field vector 10a, shown in FIG. 3(a), corresponds to an electric field directed from the front side of the drawing toward the rear side thereof, and the electric field vector 10b, shown in FIG. 3(b), corresponds to an electric field directed from the rear side of the drawing toward the front side thereof. By applying the voltage indicated by the electric field vector 10a, the piezoelectric sheet 2 is deformed in a manner as shown in FIG. 3(a), while, by applying the voltage indicated by the electric field vector 10b, the piezoelectric sheet 2 is deformed in a manner as shown in FIG. 3(b).

Although not shown in the drawings, the piezoelectric sheet 3 is also allowed to exert the same deformation as that of the piezoelectric sheet 2.

Figure 4:
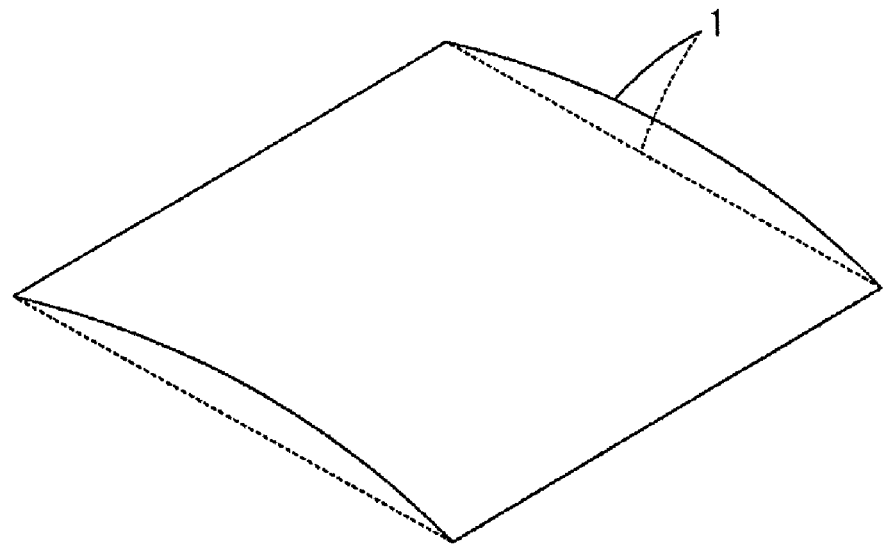
FIG. 4 is a perspective view that shows a deformed state of the sheet-type vibrator 1 shown in FIG. 1 upon application of an electric field thereto.

Therefore, the two piezoelectric sheets 2 and 3 are bonded to and laminated with each other, as shown in FIG. 1, and by applying voltages to the electrodes 4 to 7 so as to generate deformations in respectively opposite directions between the piezoelectric sheet 2 and the piezoelectric sheet 3, the sheet-type vibrator 1 is allowed to form a bimorph structure that generates vibration, as shown in FIG. 4. In FIG. 4, the original state is indicated by a broken line, and a state after the deformation is indicated by a solid line.

In the sheet-type vibrator 1 shown in FIG. 1, the thickness of each of components forming the vibrator is illustrated in an exaggerated manner. The actual thickness of each of the piezoelectric sheets 2 and 3 is in a range of 0.05 to 0.1 mm, the actual thickness of each other the first electrodes 4 and 6 is in a range of 50 to 100 nm, the actual thickness of each of the second electrodes 5 and 7 is in a range of 0.3 to 2 μm, and the actual thickness of the adhesive layer 8 is in a range of 1 to 10 μm. In this case, the thicknesses of the respective components are not necessarily limited to these ranges, and may be appropriately set in association with the physical values of the respective materials.

As described above, since the thicknesses of the respective electrodes 4 to 7 are extremely thin, these may be made substantially transparent, and the adhesive layer 8 may also be made transparent, and since the PLLA sheets to form the piezoelectric sheets 2 and 3 are also superior in transparency, the sheet-type vibrator 1 as a whole may maintain high transparency.

Figure 5:
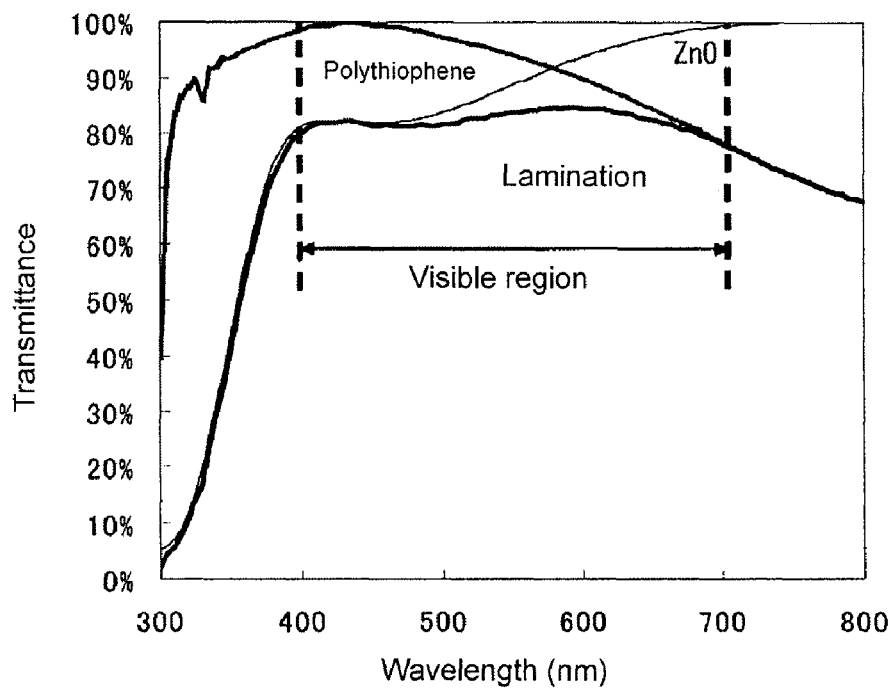
FIG. 5 is a graph that shows a relationship between the wavelength and transmittance of light, with respect to each of a zinc oxide electrode layer, a polythiophene electrode layer, and a laminated member of these.

FIG. 5 is a graph that shows a relationship between wavelength of light and transmittance, with respect to a zinc oxide electrode layer and a polythiophene electrode layer, as well as a laminated member of these. In FIG. 5, the zinc oxide electrode layer is indicated as "ZnO", while the polythiophene electrode layer is indicated as "Polythiophene", and a layer formed by laminating these is indicated as "Lamination".

The data obtained as the zinc oxide electrode layer correspond to data derived from a structure that is made by film-forming zinc oxide having a Ga content of 5.7% by weight in terms of oxide conversion on a PLLA sheet with a thickness of 100 nm. The data obtained as the polythiophene electrode layer correspond to data derived from a structure that is made by film-forming polyethylene dioxythiophene on a PLLA sheet with a thickness of 0.3 μm. The transmittance of each of the zinc oxide electrode layer and the polythiophene electrode layer is standardized so that the maximum transmittance is set to 100%, with a loss portion due to reflection being excluded from an actually measured transmittance straight line.

As shown in FIG. 5, the zinc oxide electrode layer has a great absorption in a region having a wavelength of 400 nm or less. That is, the great absorption is exerted in an ultraviolet-ray region. Moreover, in a region from 400 to 450 nm, the absorption becomes slightly greater in comparison with the other wavelength bands. That is, light rays from violet to blue are slightly absorbed in comparison with those light rays having the other colors. Accordingly, yellow that is a complementary color thereto is emphasized to make the zinc oxide electrode layer appear slightly yellowish.

As shown in FIG. 5, the polythiophene electrode layer has such a characteristic that the transmittance is gradually reduced toward a region having a longer wavelength, with a peak transmittance being set near a wavelength of 430 nm. Therefore, the polythiophene electrode layer is made to appear slightly bluish.

In the case where the above-mentioned zinc oxide electrode layer and polythiophene electrode layer are overlapped with each other, the color tone of the transmitted light is determined in accordance with the subtractive mixture of colors. Therefore, the transmittance of the transmitted light is represented by a product of the transmittance of the zinc oxide electrode layer and the transmittance of the polythiophene electrode layer. As shown in FIG. 5, the transmittance straight line of "Lamination" becomes substantially a flat state in a range of visible light (380 nm to 700 nm), with the result that no color tone is exerted. That is, it becomes possible to make the layers colorless.

The degree of coloring of the zinc oxide electrode layer varies slightly depending on the conditions at the time of film forming, the amounts of elements to be doped therein, the film thickness and the like. All of these factors can be controlled so that a desired degree of coloring can be achieved. In the same manner, the degree of coloring of the polythiophene electrode layer also varies slightly depending on the conditions at the time of film forming, the film thickness and the like. All of these factors can also be controlled so that a desired degree of coloring can be achieved. Therefore, the coloring degree of transmitted light can be freely controlled. In other words, colorless conditions can be selected in association with the respective conditions.

In the case of a conductor formed by zinc oxide (ZnO) being doped with a IIIB family element, for example, when Ga is used as a dopant, the relationship between the doped amount and the physical characteristics is reported by "J. Vac. Soc. (Vacuum), Vol. 47, No. 10, (2004) p. 734, written by Tadatsugu Minami, et al.", and the lowest resistivity is obtained when the doped amount is 2 to 4% by weight in terms of $Ga_2O_3$ conversion. Since an increase in the doped amount relatively causes an increase in resistivity, the applicable range is normally set up to about 2 to 6% by weight, even if the range of the doped amount is expanded. This arrangement is made because, upon consideration of the application as the transparent conductive film, reducing the resistivity as small as possible is more advantageous, and because it is unnecessary to make the resistivity higher by further increasing the doped amount thereof.

The reason for the reduction in resistivity due to the doping is based upon the following facts. As the dopant for ZnO, Ga, Al and In are proposed as typical examples of the element. In the case where ZnO is doped with an oxide of any one of these IIIB family elements, since a divalent Zn site is substituted with a trivalent cation, an excessive electron forms a carrier so that an n-type conductivity is exerted. Moreover, in the case where a film is grown under a condition where an oxygen supply is lower than its stoichiometric coefficient by using a film-forming method, oxygen vacancies occur in a film to be formed, and electrons form carriers so that the n-type conductivity is exerted.

However, in the case of a ZnO film with a reduced dope amount, it is confirmed in a moisture resistance test that severe degradation is caused.

The reason that a doped amount of an oxide of at least one kind selected from the group consisting of Ga, Al and In that are IIIB family elements is preferably set in a range of 7 to 40% by weight, as described earlier, is because, in the case of a doped amount less than 7% by weight, its moisture resistance is lowered, while in the case of a doped amount exceeding 40% by weight, it becomes difficult to obtain a transparent electrode with low resistivity that is applicable to practical use.

Additionally, even in the case where the doped amount to ZnO is altered within the above-mentioned range of 7 to 40% by weight, it is confirmed that its change in transmittance is little.

Although the above explanation has been given by exemplifying PLLA as an organic polymer forming the piezoelectric sheets 2 and 3, the organic polymer is not necessarily limited to PLLA, and PBLG (poly-γ-benzyl-L-glutaminate) that exerts a shear piezoelectric characteristic similar to that of PLLA, and PVDF, a vinylidene fluoride-trifluoroethylene copolymer and the like to which a piezoelectric property is applied by poling, may be used. However, since the PVDF and vinylidene fluoride-trifluoroethylene copolymer are originally colored materials, the effects of the present invention are not necessarily exerted effectively by using these materials.

Figure 6:
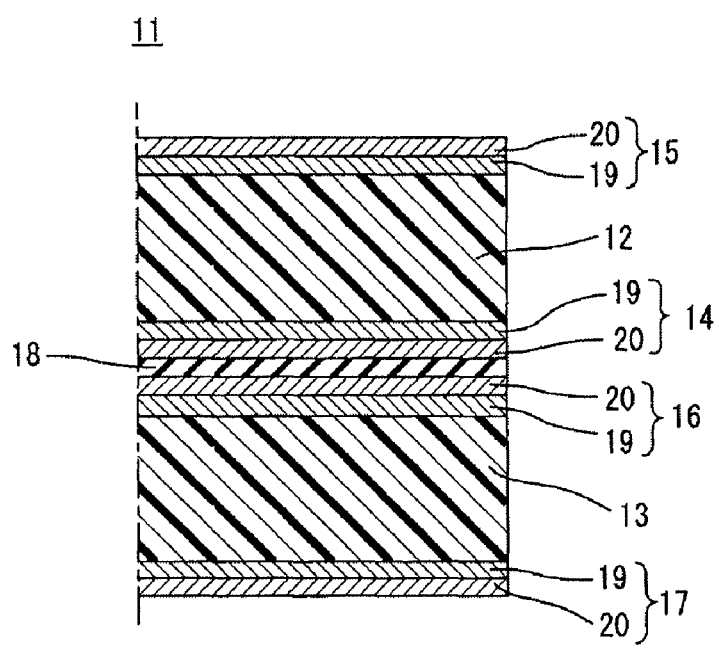
FIG. 6 is an enlarged cross-sectional view that shows one portion of a sheet-type vibrator 11 in accordance with a second embodiment of the present invention.

FIG. 6 is an enlarged cross-sectional view that shows one portion of a sheet-type vibrator 11 in accordance with a second embodiment of the present invention.

The sheet-type vibrator 11 has a bimorph structure in which two sheets of piezoelectric sheets 12 and 13 are bonded to each other. On first and second main surfaces opposite to each other of one of the piezoelectric sheets 12, first and second electrodes 14 and 15 are respectively formed, and on first and second main surfaces opposite to each other of the other piezoelectric sheet 13, first and second electrodes 16 and 17 are respectively formed. The first electrode 14 of the piezoelectric sheet 12 and the first electrode 16 of the piezoelectric sheet 13 are joined to each other with an adhesive layer 18 interposed therebetween.

In this sheet-type vibrator 11, the piezoelectric sheets 12 and 13 as well as the adhesive layer 18 are made from the same materials as those of the piezoelectric sheets 2 and 3 as well as the adhesive layer 18 of the first embodiment, and the joining method with the adhesive layer 18 interposed therebetween is the same as that used for the first embodiment.

In the second embodiment, each of the electrodes 14 to 17 is characterized by having a two-layer structure including the zinc oxide electrode layer 19 and the polythiophene electrode layer 20 in the same manner. In particular, in this embodiment, the zinc oxide electrode layer 19 is formed on the side closer to the piezoelectric sheets 12 and 13, while the polythiophene electrode layer 20 is formed on the side farther from the piezoelectric sheets 12 and 13.

The conductivity of the zinc oxide electrode layer 19 is about 1 to $3 \times 10^5$ [S/m], and the conductivity of the polythiophene electrode layer 20 is a few tenths of a conductivity of the zinc oxide electrode layer 19, and the resistivity thereof is several tens of times (about twenty to thirty times higher: varying depending on film-forming conditions) higher than that of the zinc oxide electrode layer 19. For example, in the case where, for example, the sheet-type vibrator 11 is used as a transparent speaker or the like, its resistivity is preferably made lower so as to make its power consumption smaller and also to make its signal tracking property higher; therefore, it is more advantageous to make each of the electrodes 14 to 17 by using only the zinc oxide electrode layer 19, rather than making each of them by using only the polythiophene electrode layer 20.

Nevertheless, in the second embodiment, each of the electrodes 14 to 17 is formed into the two-layer structure of the zinc oxide electrode layer 19 and the polythiophene electrode layer 20. The effect for obtaining colorless layers by superposing the zinc oxide electrode layer 19 and the polythiophene electrode layer 20 is obtained in the same manner as in the first embodiment. In particular, in accordance with the second embodiment, since the zinc oxide-based layers 19 are respectively formed on the two main surfaces of each of the piezoelectric sheets 12 and 13, it is possible to effectively suppress deformations, such as contraction due to heat, of the piezoelectric sheets 12 and 13.

Additionally, since the zinc oxide electrode layers 19 are formed on the two main surfaces of each of the piezoelectric sheets 12 and 13, the amplitude of the bimorph vibration of the sheet-type vibrator 11 is exerted in a suppressing direction in comparison with the case of the first embodiment; however, the suppressed component may be compensated for, for example, by making the applied voltage higher.

Moreover, since each of the electrodes 14 to 17 is formed, while the zinc oxide electrode layer 19 is being directly made in contact with the polythiophene electrode layer 20, the thickness of each of the zinc oxide electrode layer 19 and the polythiophene electrode layer 20 can be made thinner. Moreover, an increase of the resistivity, caused by the thinner thickness of the zinc oxide electrode layer 19, can be compensated for to a certain degree, by the use of the polythiophene electrode layer 20.

Moreover, the second electrodes 15 and 17, located on the outsides of the piezoelectric sheets 12 and 13, tend to have micro-cracks since comparatively large expansions and contractions are forcefully repeated on the zinc oxide electrode layer 19; however, since the polythiophene electrode layer 20 is formed in a manner so as to cover the zinc oxide electrode layer 19, there is no possibility of an electrical fracture that is a critical failure.

Figure 7:
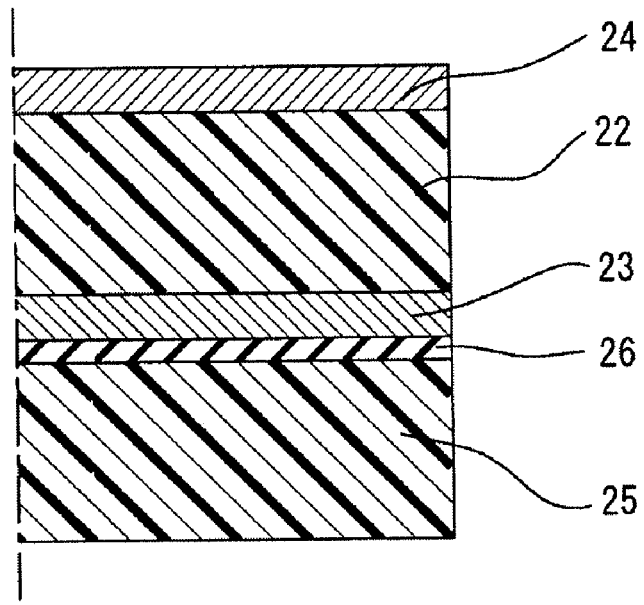
FIG. 7 is an enlarged cross-sectional view that shows one portion of a sheet-type vibrator 21 in accordance with a third embodiment of the present invention.

FIG. 7 is an enlarged cross-sectional view that shows one portion of a sheet-type vibrator 21 in accordance with a third embodiment of the present invention.

The sheet-type vibrator 21 has a unimorph structure in which a single piezoelectric sheet 22 is provided and on the first and second main surfaces opposite to each other of the piezoelectric sheet 22, first and second electrodes 23 and 24 are respectively formed. In this embodiment, the first electrode 23 is made of a zinc oxide electrode layer, and the second electrode 24 is made of a polythiophene electrode layer.

Moreover, the sheet-type vibrator 21 is provided with a backing sheet 25, and the backing sheet 25 is joined to the first electrode 23 through an adhesive layer 26.

In this sheet-type vibrator 21, the piezoelectric sheet 22 and the adhesive layer 26 are made from the same materials as those of the piezoelectric sheets 2 and 3 as well as the adhesive layer 8 in the first embodiment. The backing sheet 25 may be made from, for example, PLLA, in the same manner as in the piezoelectric sheet 22; however, since this material, as a simple substance, has no such function as to be deformed, the material doesn't need to have a piezoelectric characteristic, and may be made from, for example, polyethylene terephthalate, polymethyl methacrylate, polycarbonate, or the like.

Upon placing this sheet-type vibrator 21, for example, on a display, it is arranged so as to allow the backing sheet 25 to face outward so that the backing sheet 25 is used for protecting scratches.

Moreover, in the sheet-type vibrator 21 shown in FIG. 7, the first electrode 23, made of a zinc oxide electrode layer, is formed at a position to be sandwiched by the piezoelectric sheet 22 and the backing sheet 25. Therefore, since the first electrode 23 is placed at a portion in which mechanical expansions and contractions in the sheet-type vibrator 21 are minimized, it is possible to reduce factors in which the first electrode 23 hinders the bending vibration of the sheet-type vibrator 21.

Figure 8:
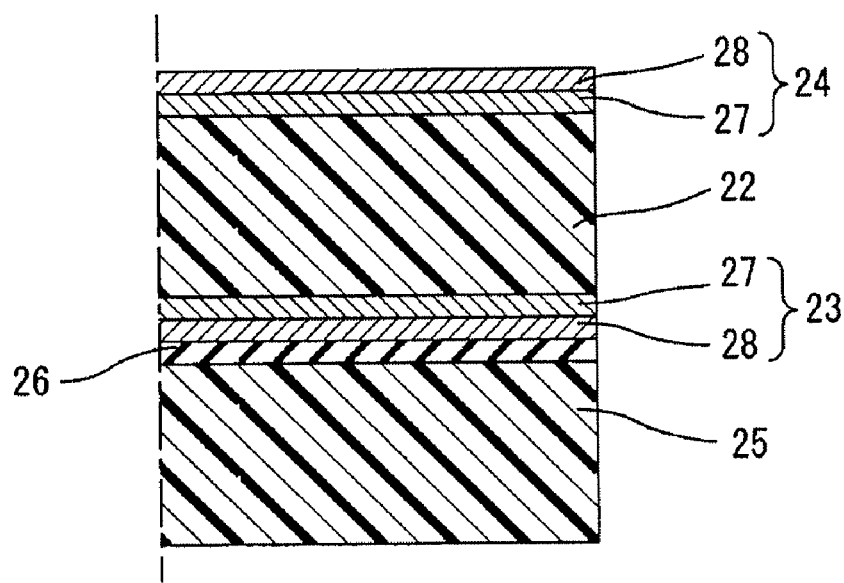
FIG. 8 is an enlarged cross-sectional view that shows one portion of a sheet-type vibrator 21a in accordance with a fourth embodiment of the present invention.

FIG. 8 is an expanded cross-sectional view that shows one portion of a sheet-type vibrator 21a in accordance with a fourth embodiment of the present invention. In FIG. 8, those components that correspond to those shown in FIG. 7 are indicated by the same reference numerals, and overlapping descriptions thereof will be omitted.

In the sheet-type vibrator 21a shown in FIG. 8, each of the first and second electrodes 23 and 24 is formed into a two-layer structure constituted by both of a zinc oxide electrode 27 and a polythiophene electrode 28. In this case, the zinc oxide electrode layer 27 is formed so as to be made in contact with the main surface of the piezoelectric sheet 22, with the polythiophene electrode 28 being formed on the outside of the zinc oxide electrode layer 27.

In accordance with the fourth embodiment, the same effects as those of the second embodiment can be obtained.

Figure 9:
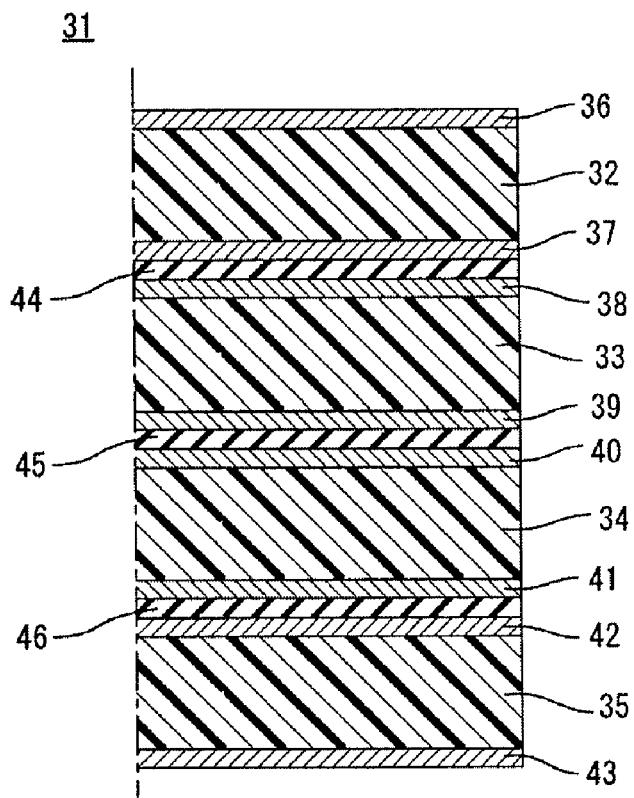
FIG. 9 is an enlarged cross-sectional view that shows one portion of a sheet-type vibrator 31 in accordance with a fifth embodiment of the present invention.

FIG. 9 is an expanded cross-sectional view that shows one portion of a sheet-type vibrator 31 in accordance with a fifth embodiment of the present invention.

The sheet-type vibrator 31 is provided with at least three, for example, four piezoelectric sheets 32 to 35. On main surfaces opposite to each other of the piezoelectric sheet 32, electrodes 36 and 37 are respectively formed, on main surfaces opposite to each other of the piezoelectric sheet 33, electrodes 38 and 39 are respectively formed, and on main surfaces opposite to each other of the piezoelectric sheet 34, electrodes 40 and 41 are respectively formed. On main surfaces opposite to each other of the piezoelectric sheet 35, electrodes 42 and 43 are respectively formed. Moreover, between the electrodes 37 and 38, between the electrodes 39 and 40, as well as between the electrodes 41 and 42, adhesive layers 44, 45 and 46 are formed so that a structure in which the four piezoelectric sheets 32 to 35 are bonded to one another is formed.

In this sheet-type vibrator 31, the piezoelectric sheets 32 to 35 and the adhesive layers 44 to 46 are made by using the same materials as those of the piezoelectric sheets 2 and 3 and the adhesive layer 8 in the aforementioned sheet-type vibrator 1.

Moreover, the electrodes 38 to 41, formed on the respective main surfaces of the piezoelectric sheets 33 and 34 located comparatively inner sides in the laminating direction, are made of zinc oxide electrode layers, and the electrodes 36, 37, 42 and 43, formed on the respective main surfaces of the piezoelectric sheets 32 and 35 located comparatively outer sides in the laminating direction, are made of polythiophene electrode layers.

The sheet-type vibrator 31 forms a bimorph having a multi-layer structure in which directions of electric fields to be applied to the respective piezoelectric sheets 32 to 35 are determined in such a manner that, when the piezoelectric sheets 32 and 33 are operated so as to expand, the piezoelectric sheets 34 and 35 are allowed to contract, while, in contrast, when the piezoelectric sheets 32 and 33 are operated so as to contract, the piezoelectric sheets 34 and 35 are allowed to expand.

Each of the piezoelectric sheets 32 to 35 of the sheet-type vibrator 31 of this type is made thinner in comparison with those two piezoelectric sheets 2 and 3, for example, as shown in FIG. 1, of the sheet-type vibrator 1, and is set to a thickness of, for example, 0.03 to 0.07 mm. By making the piezoelectric sheets 32 to 35 thinner in this manner, the electric field intensity to be applied to each of the piezoelectric sheets 32 to 35 can be made higher. As a result, for example, when compared with the sheet-type vibrator 1 of the first embodiment, supposing that the same voltage is applied, the amplitude can be made wider; in contrast, supposing that an attempt is made to obtain the same amplitude, the driving voltage can be made lower.

In the fifth embodiment, the electrodes 38 to 41, made of the zinc oxide electrode layers, are formed on the piezoelectric sheets 33 and 34 located on the inner side, and the electrodes 36, 37, 42 and 43, made of the polythiophene electrode layers, are formed on the piezoelectric sheets 32 and 35 located on the outer side so that transmitted light is made colorless. Moreover, in the present embodiment, since the electrodes 38 to 41 that are placed at a position with small expansions and contractions are made of zinc oxide electrode layers, and since the electrodes 36, 37, 42 and 43 that are placed at a position with large expansions and contractions are made of polythiophene electrode layers; thus, it is possible to prevent the zinc oxide electrode layers from greatly hindering the bending vibration of the sheet-type vibrator 31.

Additionally, the materials forming the respective electrodes 36 to 43 can be variably changed depending on designing conditions.

The following description will discuss applications of the sheet-type vibrator in accordance with the present invention.

Figure 10:
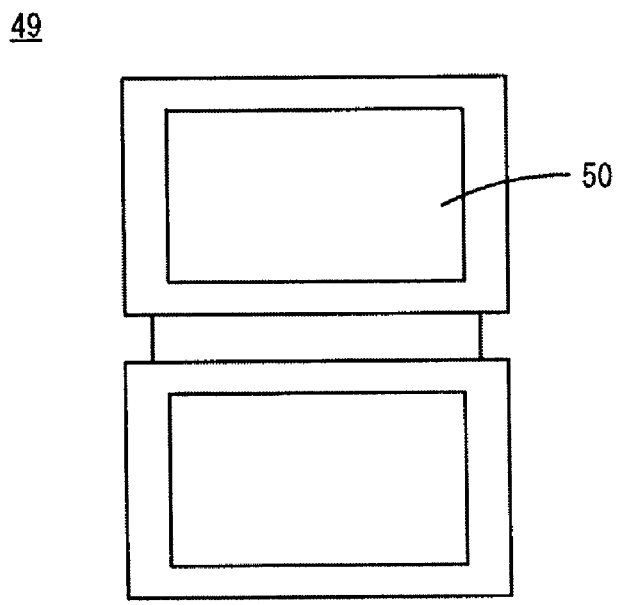
FIG. 10 is a front view that shows a portable game machine 49 serving as a desirable application of the sheet-type vibrator in accordance with the present invention.
Figure 11:
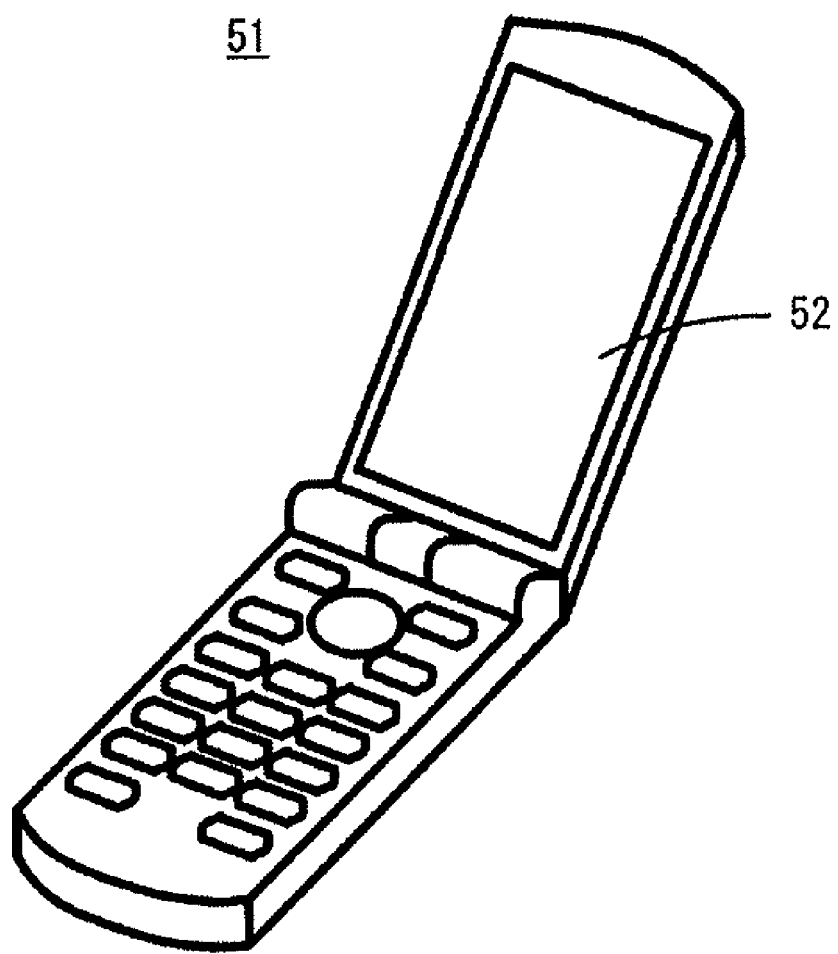
FIG. 11 is a perspective view that shows a portable telephone 51 serving as a desirable application of the sheet-type vibrator in accordance with the present invention.

The sheet-type vibrator in accordance with the present invention can be advantageously used in acoustic apparatuses. More specifically, since the sheet-type vibrator of the present invention can be made transparent, for example, a transparent speaker can be prepared. In this case, since no part such as an exciter is required, the entire surface of the speaker can be made transparent. For this reason, for example, on a display surface 50 of a portable game machine 49 shown in FIG. 10, or on a display surface 52 of a portable telephone 51 shown in FIG. 11, a speaker can be directly disposed, while an image located beneath can be clearly made visible. In the same manner, this can be directly disposed also on a display surface of an electronic dictionary, an electronic notebook, a personal computer, a television receiver, or the like.

In particular, since the piezoelectric sheet forming the sheet-type vibrator is made from an organic polymer, it is possible to achieve a noted characteristic that no cracking is caused even when subjected to a normally-applied impact. Therefore, this is advantageously applied to portable apparatuses, such as portable game machines and portable telephones. Moreover, since the piezoelectric sheet made from an organic polymer can be bended, it can also be applied to, for example, a paper display or the like using an organic EL device.

In order to provide high quality sound to a speaker, the speaker needs to have a large size; however, the piezoelectric speaker currently used has a limitation in this purpose due to restrictions in the space of an apparatus. As described above, in accordance with the present invention, the speaker can be made transparent, and this can be directly disposed on the display surface. Therefore, the area of the speaker can be made larger to improve its sound quality. Moreover, since it is possible to omit a conventional built-in speaker, the apparatus can be consequently miniaturized, or new functional parts can be installed in a portion from which the built-in speaker has been removed so that a highly functional apparatus can be achieved.

The present invention has been explained by exemplifying a sheet-type vibrator in which a sheet made from a transparent organic polymer is driven based upon its piezoelectric characteristic; however, not limited to the vibrator using only the piezoelectric characteristic, the present invention is also applicable to a sheet-type vibrator that is driven only by an electrostatic force (electrostrictive force). Even in this latter case, although kinds of an organic polymer forming the sheet and a voltage to be applied are made different, the same structures as those of the aforementioned embodiments can be adopted.

The invention claimed is:

1. A sheet-type vibrator comprising:
a functional sheet made from a transparent organic polymer; and
first and second electrodes respectively located on first and second main surfaces of the functional sheet,
wherein the first electrode includes a zinc oxide electrode layer mainly containing zinc oxide, and the second electrode includes a polythiophene electrode layer made from a conductive polymer containing thiophene in a molecule structure thereof.

2. The sheet-type vibrator according to claim 1, wherein a plurality of the functional sheets are laminated together such that the first and second main surfaces of adjacent functional sheets are opposed to each other.

3. The sheet-type vibrator according to claim 1, further comprising: a backing sheet attached to the functional sheet with the first electrode interposed therebetween, the backing sheet comprising a transparent organic polymer.

4. The sheet-type vibrator according to claim 1, wherein the first electrode is the zinc oxide electrode layer, and the second electrode is the polythiophene electrode layer.

5. The sheet-type vibrator according to claim 1, wherein the second electrode also includes the zinc oxide electrode layer, and the first electrode also includes the polythiophene electrode layer.

6. The sheet-type vibrator according to claim 5, wherein the zinc oxide electrode layers are located proximal to the functional sheet, and the polythiophene electrode layers are located distal from the functional sheet relative to the zinc oxide electrode layers.

7. The sheet-type vibrator according to claim 1, further comprising:
a second functional sheet made from the transparent organic polymer; and
third and fourth electrodes respectively located on first and second main surfaces of the second functional sheet,
wherein the third electrode includes a zinc oxide electrode layer mainly containing zinc oxide, and the fourth electrode includes a polythiophene electrode layer made from a conductive polymer containing thiophene in a molecule structure thereof,
wherein the functional sheet and the second functional sheet are arranged in a manner such that the first and third electrodes are adjacent each other, and the second and fourth electrodes are on outer sides of their respective functional sheets.

8. The sheet-type vibrator according to claim 1, wherein the zinc oxide electrode layer has a crystalline form in which c-axes are grown in a plurality of directions that are mutually different from one another.

9. The sheet-type vibrator according to claim 1, wherein the zinc oxide electrode layer includes zinc oxide doped with at least one kind selected from the group consisting of Ga, Al and In at a doping concentration in a range from 7 to 40% by weight in terms of each oxide conversion.

10. The sheet-type vibrator according to claim 1, wherein the conductive polymer containing thiophene in a molecule structure thereof is polyethylene dioxythiophene.

11. An acoustic apparatus comprising the sheet-type vibrator according to claim 1.

12. A sheet-type vibrator comprising:
a plurality of laminated functional sheets, the functional sheets comprising a transparent organic polymer; and
electrodes located on respective main surfaces opposite to each other of each of the functional sheets,
wherein a first set of the electrodes include a zinc oxide electrode layer mainly containing zinc oxide, and a second set of the electrodes include a polythiophene electrode layer made from a conductive polymer containing thiophene in a molecule structure thereof.

13. The sheet-type vibrator according to claim 12, wherein the plurality of the functional sheets are three, and the three functional sheets are arranged so that the electrodes on the respective main surfaces of a center functional sheet of the three functional sheets comprise the first set of electrodes, and the electrodes on the respective main surfaces of outer functional sheets of the three functional sheets comprise the second set of electrodes.

14. The sheet-type vibrator according to claim 12, wherein each of the functional sheets is a piezoelectric sheet.

15. The sheet-type vibrator according to claim 10, wherein the organic polymer is polylactate.

16. The sheet-type vibrator according to claim 8, wherein the zinc oxide electrode layer has a crystalline form in which c-axes are grown in a plurality of directions that are mutually different from one another.

17. The sheet-type vibrator according to claim 8, wherein the zinc oxide electrode layer includes zinc oxide doped with at least one kind selected from the group consisting of Ga, Al and In at a doping concentration in a range from 7 to 40% by weight in terms of each oxide conversion.

18. The sheet-type vibrator according to claim 8, wherein the conductive polymer containing thiophene in a molecule structure thereof is polyethylene dioxythiophene.

19. An acoustic apparatus comprising: the sheet-type vibrator according to claim 8.

* * * * *